US011015879B2

(12) United States Patent
Cai et al.

(10) Patent No.: US 11,015,879 B2
(45) Date of Patent: May 25, 2021

(54) INTERFACE-FREE THERMAL MANAGEMENT SYSTEM FOR HIGH POWER DEVICES CO-FABRICATED WITH ELECTRONIC CIRCUIT

(71) Applicant: TELEDYNE SCIENTIFIC & IMAGING, LLC, Thousand Oaks, CA (US)

(72) Inventors: Steve Q. Cai, Newbury Park, CA (US); Avijit Bhunia, Newbury Park, CA (US); Tadej Semenic, Thousand Oaks, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 78 days.

(21) Appl. No.: 16/194,690

(22) Filed: Nov. 19, 2018

(65) Prior Publication Data
US 2019/0086162 A1   Mar. 21, 2019

Related U.S. Application Data

(62) Division of application No. 15/184,891, filed on Jun. 16, 2016.

(51) Int. Cl.
*F28F 3/04* (2006.01)
*F28D 15/02* (2006.01)
(Continued)

(52) U.S. Cl.
CPC .......... *F28F 3/048* (2013.01); *F28D 15/0233* (2013.01); *F28D 15/046* (2013.01);
(Continued)

(58) Field of Classification Search
CPC .... F28D 15/02; F28D 15/0233; F28D 15/046; H05K 7/20336; B33Y 10/00; B23P 2700/09; F28F 3/048; H01L 23/427
See application file for complete search history.

(56) References Cited

U.S. PATENT DOCUMENTS 3,815,575 A   6/1974 Danis
4,352,392 A   10/1982 Eastman
(Continued)

OTHER PUBLICATIONS

Jacobi et al., "Heat Transfer Surface Enhancement through the Use of Longitudinal Vortices: A Review of Recent Progress", Experimental Thermal and Fluid Science, 1995, Elsevier Science Inc., pp. 295-309.

(Continued)

*Primary Examiner* — Gordon A Jones
(74) *Attorney, Agent, or Firm* — K&L Gates LLP

(57) ABSTRACT

A thermal-interface-material (TIM)-free thermal management apparatus includes a thermally-conductive unitary structure having an integrated circuit (IC) side and cooling system side, the thermally-conductive unitary structure including a plurality of high aspect ratio micro-pillars or porous structures extending from the IC side and a cooling system extending from the cooling system side. The cooling system may be selected from the group consisting of: a vapor chamber, micro-channel cooler, jet-impingement chamber, and air-cooled heat sink. The cooling system and the plurality of high aspect ratio micro-pillars form part of the same homogenous and thermally-conductive unitary structure.

17 Claims, 4 Drawing Sheets

(51) Int. Cl.
*F28D 15/04* (2006.01)
*H01L 23/427* (2006.01)
*F28D 21/00* (2006.01)

(52) U.S. Cl.
CPC .... *H01L 23/427* (2013.01); *F28D 2021/0028* (2013.01); *F28F 2255/18* (2013.01); *F28F 2260/00* (2013.01)

(56) References Cited

U.S. PATENT DOCUMENTS

| | | | |
|---|---|---|---|
| 4,931,424 A | 6/1990 | Henty | |
| 5,168,348 A | 12/1992 | Chu et al. | |
| 5,270,572 A | 12/1993 | Nakajima et al. | |
| 5,316,075 A | 5/1994 | Quon et al. | |
| 5,349,831 A | 9/1994 | Daikoku et al. | |
| 5,353,865 A | 10/1994 | Adiutori et al. | |
| 5,687,577 A | 11/1997 | Ballard et al. | |
| 5,719,444 A | 2/1998 | Tilton et al. | |
| 5,847,927 A | 12/1998 | Minning et al. | |
| 5,959,351 A | 9/1999 | Sasaki et al. | |
| 5,966,291 A | 10/1999 | Baumel et al. | |
| 5,978,220 A | 11/1999 | Frey et al. | |
| 6,082,443 A * | 7/2000 | Yamamoto | F28D 15/0233 165/104.21 |
| 6,366,462 B1 | 4/2002 | Chu et al. | |
| 6,414,867 B2 | 7/2002 | Suzuki et al. | |
| 6,452,798 B1 | 9/2002 | Smith et al. | |
| 6,473,303 B2 | 10/2002 | Kaufmann | |
| 6,594,149 B2 | 7/2003 | Yamada et al. | |
| 6,650,542 B1 | 11/2003 | Chrysler et al. | |
| 6,736,192 B2 | 5/2004 | Chang | |
| 6,738,253 B2 | 5/2004 | Beuille et al. | |
| 6,761,796 B2 | 7/2004 | Srivastava et al. | |
| 6,960,278 B2 | 11/2005 | Petitbon et al. | |
| 6,993,926 B2 | 2/2006 | Rini et al. | |
| 6,994,151 B2 | 2/2006 | Zhou et al. | |
| 7,035,104 B2 | 4/2006 | Meyer | |
| 7,037,846 B2 | 5/2006 | Srivastava et al. | |
| 7,042,725 B2 | 5/2006 | Martin et al. | |
| 7,092,254 B1 | 8/2006 | Monsef et al. | |
| 7,173,823 B1 | 2/2007 | Rinehart et al. | |
| 7,180,179 B2 | 2/2007 | Mok et al. | |
| 7,190,581 B1 | 3/2007 | Hassani et al. | |
| 7,255,153 B2 | 8/2007 | Berger et al. | |
| 7,277,283 B2 | 10/2007 | Campbell et al. | |
| 7,288,438 B2 | 10/2007 | Lu | |
| 7,336,486 B2 | 2/2008 | Mongia | |
| 7,344,576 B2 | 3/2008 | TeGrotenhuis et al. | |
| 7,353,859 B2 | 4/2008 | Stevanovic et al. | |
| 7,369,409 B2 | 5/2008 | Yazawa | |
| 7,375,962 B2 | 5/2008 | Campbell et al. | |
| 7,417,857 B2 | 8/2008 | Rondier et al. | |
| 7,434,308 B2 | 10/2008 | Lu et al. | |
| 7,450,378 B2 | 11/2008 | Nelson et al. | |
| 7,481,072 B2 | 1/2009 | Ostrom et al. | |
| 7,483,770 B2 | 1/2009 | Meinders et al. | |
| 7,536,870 B2 | 5/2009 | Bezama et al. | |
| 7,580,261 B2 | 8/2009 | Smith et al. | |
| 7,603,775 B2 | 10/2009 | Meng et al. | |
| 7,651,601 B2 | 1/2010 | Hwang et al. | |
| 7,755,898 B2 | 7/2010 | Aoki et al. | |
| 7,760,503 B2 | 7/2010 | Aoki et al. | |
| 7,787,248 B2 | 8/2010 | Campbell et al. | |
| 7,834,448 B2 | 11/2010 | Gerbsch | |
| 7,859,103 B2 | 12/2010 | Aoki et al. | |
| 7,859,846 B2 | 12/2010 | Hassani et al. | |
| 7,884,468 B2 | 2/2011 | Mann et al. | |
| 7,900,692 B2 * | 3/2011 | Miyahara | H01L 23/473 165/104.26 |
| 7,940,527 B2 | 5/2011 | Krause | |
| 7,942,196 B2 | 5/2011 | Lai et al. | |
| 7,992,627 B2 | 8/2011 | Bezama et al. | |
| 8,016,024 B2 | 9/2011 | Kang et al. | |
| 8,104,533 B2 | 1/2012 | Rini et al. | |
| 8,139,371 B2 | 3/2012 | Nelson et al. | |
| 8,169,779 B2 | 5/2012 | Le et al. | |
| 8,232,637 B2 | 7/2012 | Beaupre et al. | |
| 8,248,809 B2 | 8/2012 | Miller et al. | |
| 8,266,802 B2 | 9/2012 | Campbell et al. | |
| 8,327,540 B2 | 12/2012 | Michel et al. | |
| 8,333,235 B2 | 12/2012 | Chang et al. | |
| 8,482,921 B2 | 7/2013 | Cai | |
| 8,921,702 B1 * | 12/2014 | Carter | H05K 1/0272 174/252 |
| 9,252,069 B2 | 2/2016 | Bhunia et al. | |
| 9,484,284 B1 | 11/2016 | Gambin et al. | |
| 9,721,868 B2 | 8/2017 | Lin et al. | |
| 10,096,537 B1 | 10/2018 | Chen et al. | |
| 10,306,802 B1 | 5/2019 | Ditri et al. | |
| 2003/0141045 A1 | 7/2003 | Oh et al. | |
| 2005/0092403 A1 | 5/2005 | Lloyd | |
| 2005/0199372 A1 | 9/2005 | Frazer et al. | |
| 2005/0211427 A1 | 9/2005 | Kenny et al. | |
| 2006/0060328 A1 | 3/2006 | Ewes et al. | |
| 2006/0087816 A1 | 4/2006 | Ewes et al. | |
| 2006/0144565 A1 | 7/2006 | Tsai et al. | |
| 2006/0196640 A1 | 9/2006 | Siu | |
| 2007/0121299 A1 | 5/2007 | Campbell et al. | |
| 2007/0166554 A1 | 7/2007 | Ruchert et al. | |
| 2008/0266801 A1 | 10/2008 | Weiss et al. | |
| 2009/0211095 A1 | 8/2009 | Zheng | |
| 2010/0326644 A1 * | 12/2010 | Hung | F28D 15/0283 165/185 |
| 2011/0083829 A1 * | 4/2011 | Hung | H01L 23/427 165/104.26 |
| 2011/0108142 A1 * | 5/2011 | Liu | H01L 23/427 137/561 R |
| 2011/0120674 A1 * | 5/2011 | MacDonald | F28D 15/04 165/104.26 |
| 2015/0257249 A1 * | 9/2015 | Kim | H05K 5/03 361/700 |
| 2017/0338167 A1 * | 11/2017 | Bozorgi | F28F 21/086 |
| 2017/0363373 A1 | 12/2017 | Cai et al. | |

OTHER PUBLICATIONS

Lin et al., "3D Numerical heat transfer and fluid flow analysis in plate-fin and tube heat exchangers with electrohydrodynamic enhancement", Heat Mass Transfer, 2005. vol. 41, pp. 583-593.

Molki et al., "Electrohydrodynamic Enhancement of Heat Transfer for Developing Air Flow in Square Ducts", Heat Transfer Engineering, 2006, vol. 27, No. 1, pp. 35-45.

* cited by examiner

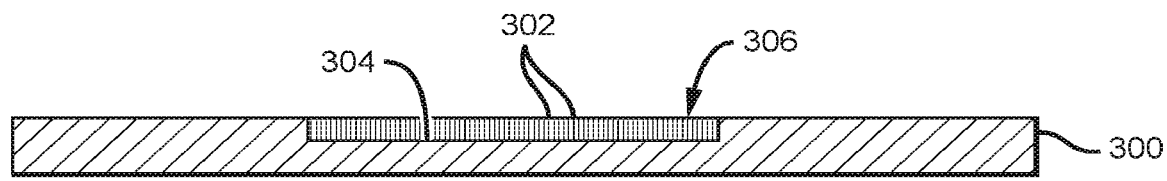
FIG. 3
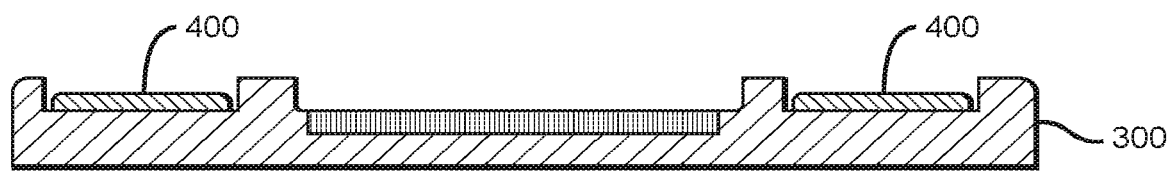
FIG. 4
FIG. 5
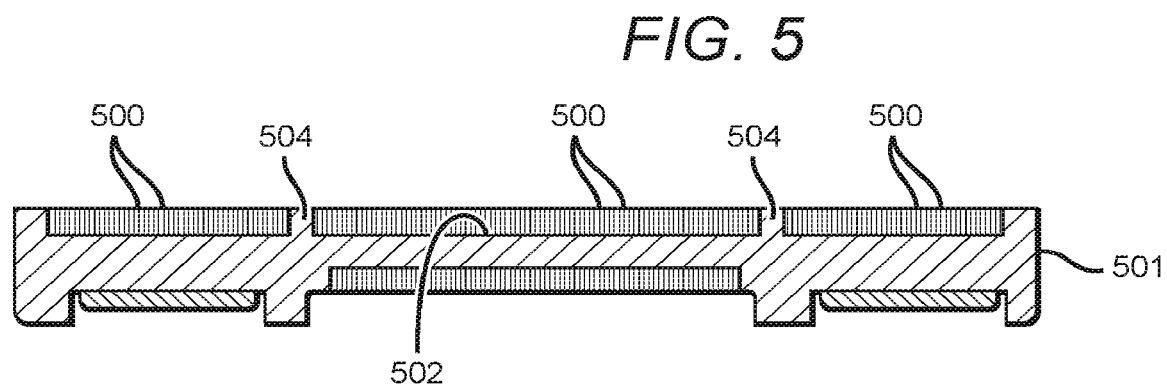

INTERFACE-FREE THERMAL MANAGEMENT SYSTEM FOR HIGH POWER DEVICES CO-FABRICATED WITH ELECTRONIC CIRCUIT

STATEMENT OF PRIORITY

This application is a divisional application filed under 35 U.S.C. § 121, of U.S. patent application Ser. No. 15/184, 891, entitled "INTERFACE-FREE THERMAL MANAGEMENT SYSTEM FOR HIGH POWER DEVICES CO-FABRICATED WITH ELECTRONIC CIRCUIT," filed on Jun. 16, 2016, the disclosure of which is incorporated herein by reference in its entirety and for all purposes.

BACKGROUND

Field of the Invention

The invention relates to cooling systems for high-power devices, and more particularly to cooling systems for integrated circuits (ICs).

Description of the Related Art

Power dissipation in electronic circuits remains an important design consideration and is becoming more important as performance for such circuits is becoming thermally limited. In microwave systems, the microwave electronic circuits are manufactured separately from its cooling system using different processes. For example, the cooling system is typically a metal structure that is coupled to the backside of the microwave electronic circuit, though in most cases making placement of a thin thermal interface material (TIM) between the two surfaces to facilitate heat transfer. In one typical example illustrated in FIG. 1, a high-power device 101 may be thermally coupled to a copper mounting plate 103 through a first TIM 105. The TIM 105 provides limited adhesion, a complementary thermal expansion coefficient and thermal path between the device and the copper mounting plate. The copper mounting plate 103 may be coupled to a cooling system 107 through a second TIM 109 that also provides thermal conduction. Examples of cooling systems include vapor chamber 111, micro-channel cooler 113, jet impingement cooler 115, and air-cooled heat sink 117.

SUMMARY

A method of building a thermal-interface-material (TIM)-free thermal management system includes providing a substrate of thermally conductive material, the substrate having an integrated circuit (IC) side, forming cross-sectional layers of a plurality of IC interfaces extending from the IC side, forming cross-sectional layers of a radio-frequency (RF) circuit on the IC side, and forming cross-sectional layers of an enclosure on an opposite side of the substrate from the IC side, so that the thermally-conductive substrate, plurality of IC interfaces, and enclosure form a unitary structure of homogenous thermally-conductive material without a TIM in between.

A thermal-interface-material (TIM)-free thermal management apparatus includes a thermally-conductive unitary structure having an integrated circuit (IC) side and cooling system side, the thermally-conductive unitary structure comprising a plurality of high aspect ratio micro-pillars or porous structures extending from the IC side and a cooling system extending from the cooling system side, with the cooling system selected from the group consisting of: a vapor chamber, micro-channel cooler, jet-impingement chamber, and air-cooled heat sink, so that the cooling system and the plurality of high aspect ratio micro-pillars form part of the same homogenous and thermally-conductive unitary structure.

An apparatus may include an integrated and unitary body of homogenous material having an integrated circuit layer, a first heat exchange layer selected from the group consisting of a vapor chamber, micro-channel cooler, jet-impingement chamber, and air-cooled heat sink; and a second heat exchange layer selected from the group consisting of fins and tabs.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIGS. 3-8 illustrate one embodiment of manufacturing steps to create the thermal-interface-material free thermal management apparatus first illustrated in FIG. 2;

DETAILED DESCRIPTION

A thermal-interface-material (TIM)-free thermal management system and its method of building are described that allows fabrication of a vapor chamber enclosure or other cooling system directly on the backside of a high-power device of an electronic circuit. By providing a substrate of thermally conductive material, the substrate having an integrated circuit (IC) side; forming cross-sectional layers of a plurality of IC interfaces extending from the IC side; forming cross-sectional layers of a radio-frequency (RF) circuit on the IC side; and forming cross-sectional layers of an enclosure on an opposite side of the substrate from the IC side; a unitary structure of homogenous thermally-conductive material is created without a TIM in between the constituent regions, using a layer-based additive manufacturing technique.

Figure 1:
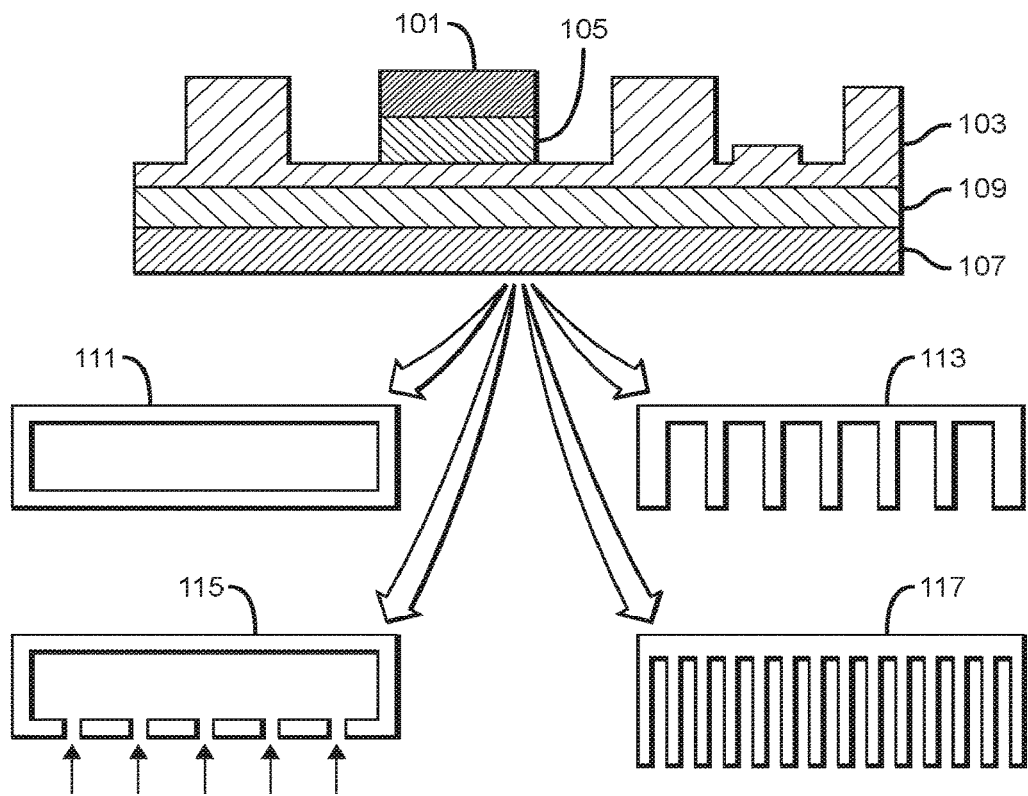
FIG. 1 is a block diagram illustrating a variety of different prior art cooling systems available for thermal coupling to a high-power device through a copper mounting plate.
Figure 2:
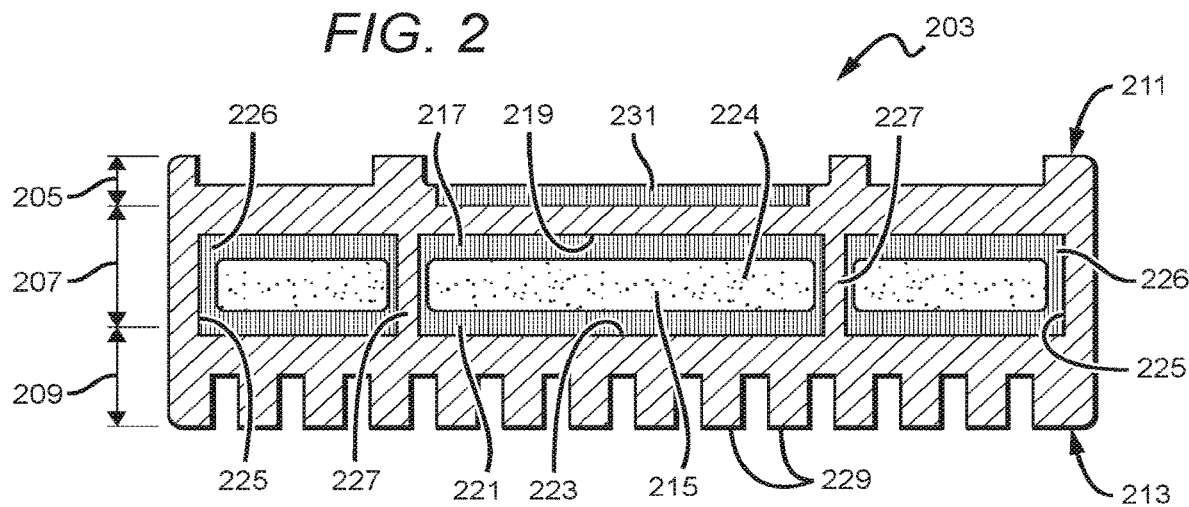
FIG. 2 is a cross sectional view of one embodiment of a thermal-interface-material free thermal management apparatus having a vapor chamber heat sink in communication with an integrated circuit (IC) through a plurality of IC interfaces and having copper fins.

FIG. 2 illustrates one embodiment of a thermally-conductive unitary structure that is TIM-free for use as a cooling system for high-power devices such as a monolithic microwave integrated circuit ("IC") or power amplifier. The TIM-free structure is a thermally-conductive unitary structure 203 that may have an IC region 205, a first heat transfer region 207 and a second heat transfer region 209. For purposes of this description, the IC region 205 may generally be described as being on an IC side 211 of the unitary structure 203 and encompassing the layers of material (see below) on which the IC is seated or otherwise embedded. The first and second heat transfer regions (207, 209) may be described as being on a cooling system side 213 that extends from the IC region 205, with the first and second heat transfer regions (207, 209) collectively described as a cooling system. In the embodiment illustrated in FIG. 2, the first heat transfer region 207 of the unitary structure 203 includes a vapor cell 215 formed in the unitary structure 203. The vapor cell 215 may have a plurality of wicks that may include evaporative wicks 217 extending from an evaporation surface 219 towards a center region 224 of the vapor chamber 215, and a plurality of condensation wicks 221 extending from a condensation surface 223 towards the center region 224 of the vapor chamber 215. The evaporative and condensation wicks (217, 221) are microstructures with appropriate internal interstitial voids that generate a capillary pull in liquid flowing through the respective microstructures (i.e., generating a "wick pumping action"). Sidewalls 225 may also support wall wicks 226 that provide a liquid path between the condensation wicks 221 and evaporative wicks 217. In embodiments, evaporative wicks 217 and condensation wicks 221 may each have a height of approximately 100 microns to 1 mm, a diameter or width of 5 to 200 μm and may establish a pore size of approximately 1 to 100 μm During operation, heat emitted from the high-power device seated on an exterior surface of the unitary structure 203 (i.e., on the IC side 211) would be received by the unitary structure 203 and conducted through the IC region 205 for presentation to the evaporation surface 219 and into the evaporation wick 217 that are each formed with the unitary structure 203. If the evaporative wick 217 is charged with a liquid, the liquid would be evaporated from the evaporation surface 219 and from the evaporation wick 217 and transported as vapor (illustrated as dispersed dots) through the center region 224. The vapor is then condensed on condensation surface 221 and the condensation wicks 221. The condensate (now in the form of a liquid) may be transported using a wick pumping action through the condensation wicks 221 back up through the wall wicks 226 that are liquid communication with the evaporation surface 219 through the evaporation wicks 217. Support pillars 227 formed in the unitary structure 203 may extend between the evaporation surface 219 and condensation surface 223 to provide structural support for the unitary structure 203. Support pillars 227 may also include support pillar wicks 228 disposed on the supporting pillars 227 to facilitate the condensate return from the condenser wick 221 to the evaporator wick 217 and condensation wicks 221. In one embodiment, the support pillar wicks 228 are grooved structures formed in the support pillars 227 as the unitary structure 203 layers are built up.

The second heat transfer region 209 of the unitary structure 203 may have a plurality of fins 229 to further increase the surface area available for heat dissipation, such as air-cooled heat sink fins, or plurality of channels, such as liquid-cooled cold plate, extending externally and away from the vapor chamber 215 on the cooling system side 213. Such fins 229 would be formed in the same process used to create the remainder of the unitary structure 203, including the vapor chamber 215 and associated evaporation wicks 217 and condensation wicks 221.

The unitary structure 203 may also be formed with an integrated circuit (IC) interface in the form of a plurality of high aspect ratio micro-pillars 231 extending away from the IC side 211 to receive a high-power device (not shown). In such an embodiment, the micro-pillars 231 may elastically deform along their length as a heat differential is developed between the heat source (not shown) and the unitary structure 203 for improved coefficient of thermal expansion ($C_{TE}$) thermal mismatch correction.

FIGS. 3 through 8 illustrate fabrication steps for one implementation of the thermally conductive unitary structure of FIG. 2 using a layer-based additive manufacturing technique. FIG. 3 illustrates a first step showing a substrate of thermally conductive material 300 provided for subsequent manufacturing steps, either by placement of pre-manufactured thermally conductive material 300 or by forming cross-sectional layers of a substrate using a layer-based additive manufacturing technique such as electroplating, electron beam melting (EBM), selective laser melting (SLM), electron beam evaporation (EBE), and selective laser sintering (SLS). The composition of the thermally conductive material 300 is not critical, although use of metals such as copper (Cu), Silver, (Ag), Nickel (Ni), gold (Au) may be advantageous. The preferred embodiment utilizes copper (Cu). A plurality of high aspect ratio micro-pillars or porous structures 302 may be built up using cross-sectional layers, thereby extending the unitary body of the substrate, preferably through use of electroplating, EBM, SLM, EBE or SLS techniques. For example, if the substrate is formed using a particular layer-based additive manufacturing technique, the high aspect ratio micro-pillars 302 would be formed using the same technique and presumably within the same set of processing steps to reduce the cost and time of manufacturing from what would otherwise exist if the substrate had to be removed from the assembly for further processing elsewhere. Or, if the substrate is a pre-formed substrate, then the type of layer-based additive manufacturing technique may be chosen according to the preferred technique for the remainder of the unitary structure fabrication. Whether selected for creation of the substrate or chosen for use after a substrate is provided, the layer-based additive manufacturing technique selected may be referred to as the "chosen layer-based additive manufacturing technique." The high aspect ratio micro-pillars 302 may be created over an area that approximates the size of a to-be-seated high-power device. In one embodiment, the array 306 may have a length and width of 5-7 mm and each of the plurality of micro-pillars 302 a height and diameter of 10-1000 μm and 1-50 μm, respectively. The top surface of the micro-pillars should be deposited with a solder layer for attachment of the electronic device. In further embodiments, the plurality of micro-pillars may be omitted.

In FIG. 4, the fabrication illustrated in FIG. 3 is modified by forming cross-sectional layers of electrical circuit portions 400 using the chosen layer-based additive manufacturing technique used in FIG. 3, so that the unitary structure of substrate 300 is dimensionally extended. In an alternative embodiment, a different thermally conductive material is used with the chosen layer-based additive manufacturing technique. For example, if the chosen layer-based additive manufacturing technique is electroplating, a first metal may be layered to form the high aspect ratio micro-pillars 302, and a second metal may be layered to form the electrical circuit portions.

In FIG. 5, the structure of FIG. 4 is modified by forming cross-sectional layers of a plurality of evaporative wicks 500. In one embodiment, the substrate 300, now referred to a "unitary structure" 501 to emphasize that each of the described structures is made using the same layer-based additive manufacturing technique, is illustrated as having been rotated from the orientation of FIG. 4 to facilitate creation of cross-sectional layers forming a plurality of evaporative wicks 500 extending from what may be an evaporation surface 502 during operation. The evaporative wicks 500 are preferably formed using layers of the same material used for each of the previously described structures (300, 302, 400), such as Cu. Each of the plurality of evaporative wicks 500 may be layered to a height of approximately 100 microns to 1 mm, a diameter of approximately 1-500 microns, and collectively have a pore size (gap size) of approximately of 1-50 microns. FIG. 5 also illustrates the beginning formation of support pillars 504.

Figure 6:
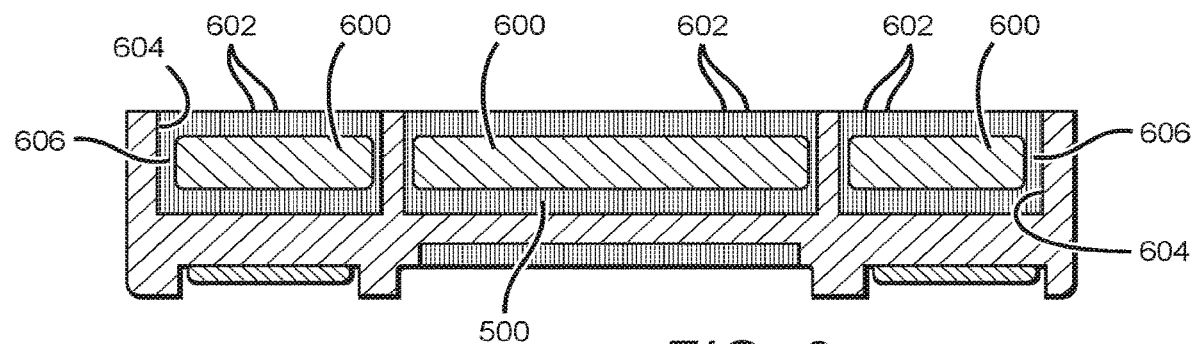
Figure 7:
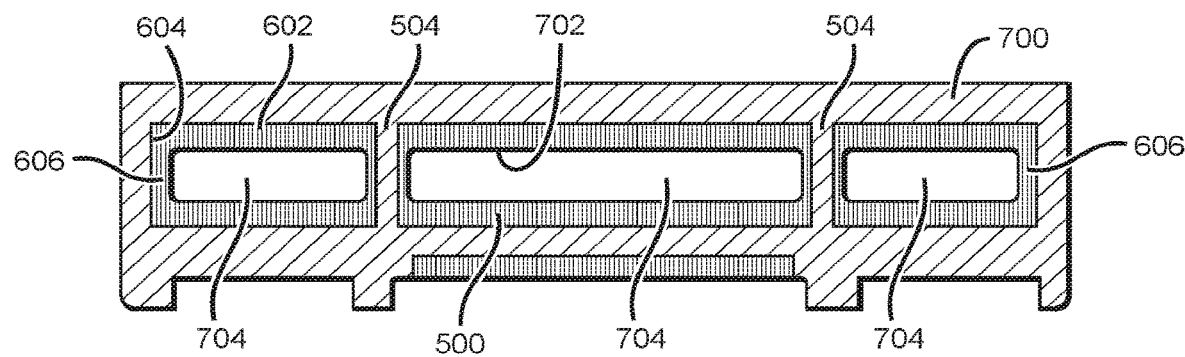
Figure 8:
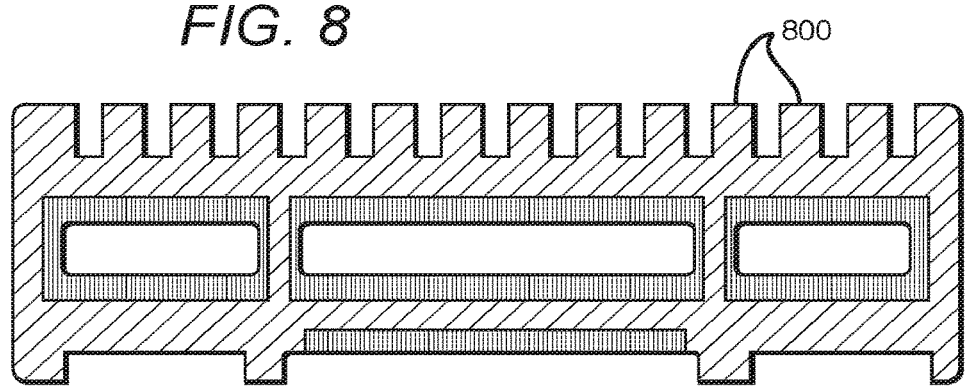

In FIG. 6, the structure of FIG. 5 is modified by forming additional cross-sectional layers of support pillars and creation of condensation wicks and sidewalls. A sacrificial layer 600 may be layered over the evaporative wicks 500 to support layered formation of condensation wicks 602 using the chosen layer-based additive manufacturing technique. Sidewalls 604 are also formed, with wall wicks 606 extending from the sidewalls 604 to provide a liquid transport path between the condensation wicks 602 and evaporative wicks 500 using the chosen layer-based additive manufacturing technique. Wick (not shown) may also be formed on the supporting pillars 504 to form liquid transport path between condensation wick 602 and evaporative wick 500. In FIG. 7, the structure of FIG. 6 is modified by forming an additional support 700 that is a layered extension of the support pillars 504 and sidewalls 604 and that, during operation, may establish a condensation surface 702. Both the support pillars 504 and sidewalls 604 provide structural support between the evaporation and condensation surfaces (502, 702). In one embodiment, the sidewalls 604, evaporation surface 502 and condensation surface 702 establish a hermetically sealed enclosure that, with the evaporative, wall and condensation wicks (500, 606, 602), establish a vapor chamber 704 that is formed as a unitary structure with the high aspect ratio micro-pillars 302 and original substrate 300. FIG. 8, the fabrication illustrated in FIG. 7 is modified by forming cross-sectional layers of thermally-conductive fins 800 to extend the heat transfer surface area available for heat transfer to receiving air (or liquid coolant).

Figure 9:
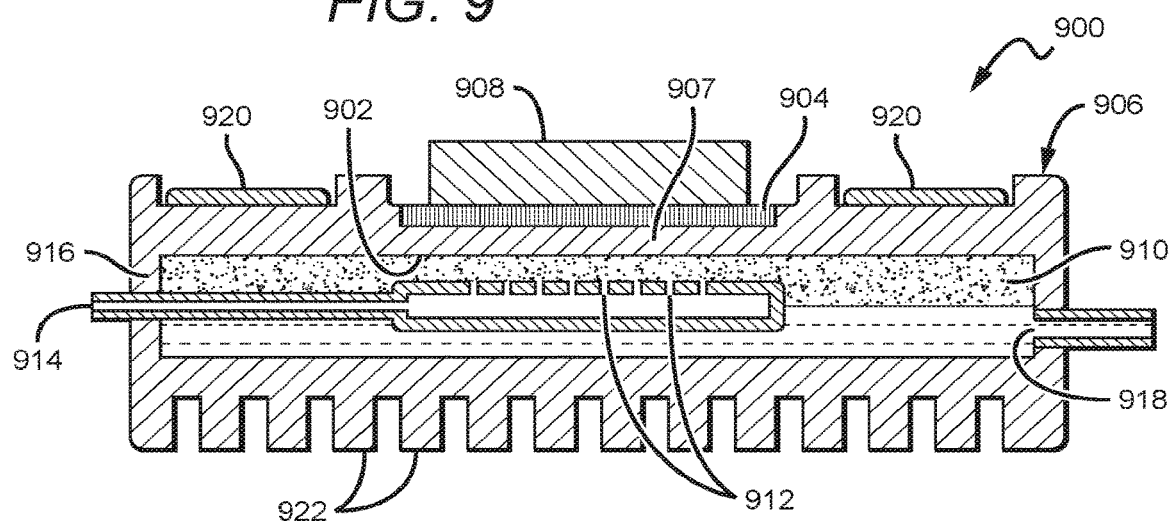
FIG. 9 illustrates another embodiment of a thermal-interface-material free thermal management apparatus having an internal liquid jet array in communication with an integrated circuit (IC) through a plurality of IC interfaces and having copper fins.

FIG. 9 illustrates an alternative embodiment of a TIM-free thermal management apparatus that has a plurality of IC interfaces in thermal communication with a cooling system that are collectively in a thermally conductive unitary structure. The plurality of IC interfaces may be in the form of high aspect ratio micro-pillars 904 formed with the unitary structure 900 and extending from an IC side 906 of the unitary structure 900 to receive a high-power device 908. Heat may be conducted from the high-power device 908 through the high aspect ratio micro-pillars 904 and into the IC side 906 of the unitary structure 900 for presentation to an jet impingement surface 902 (alternatively referred to as a heat acquisition surface) within an enclosure 910 such a jet impingement cooler. An array of micro-jets 912 may be disposed in complementary opposition to the jet impingement surface 902. An inlet 914 is provided in a first wall 916 of the enclosure for delivery of liquid to the array of micro-jets 912. Although each micro-jet 912 is illustrated having input and exit nozzles (912a, 912b) preferably having substantially similar diameters, each micro-jet 406 may have converging or diverging nozzles or have nozzles that incorporate other geometries to enable targeted spraying of coolant onto the evaporation surface 902. The coolant can be water, refrigerant, industrial liquid such as water/glycol mixtures, fuel, or any other heat transfer fluid.

In one embodiment, the jet impingement surface 902 may include microstructure tabs 914 that are formed as a part of the unitary structure 900. The preferred height of each microstructure tab 914 may be comparable to the boundary layer thickness of the chosen coolant impinging on the jet impingement surface during operation. For example, if water is used as a phase-change material for direct spray impingement on the fluid impingement surface 902, each microstructure tab 914 preferably has a square base measuring 150 µm on each side, is 150 µm tall and forms a top square shelf measuring 150 µm on each side in order to provide a continuous redevelopment of coolant thermal boundary layers during operation and to provide ridges to facilitate drainage of liquid away from the fluid impingement side 902, as the fluid impingement side 902 is preferably "upside down" in the system illustrated in FIG. 9. In such an embodiment, a fluid impingement surface 902 measuring 52 mm×23 mm has 2,300 microstructure tabs 914 spaced apart approximately 500-900 µm. The surface area of the fluid impingement surface, formed in the same process as the remainder of the unitary body 900, is thus increased by approximately 22% in comparison to a flat surface to facilitate thermal transfer of excess heat from the IC side 906 to the impinging coolant during operation. An outlet 918 is formed on another wall of enclosure to receive the spent liquid for removal from the enclosure 910.

A microwave circuit 920 may be formed with the unitary body, as may be a plurality of copper fins 922 for transport of heat from the high-power device 908. In an alternative embodiment, the copper fins 922 may instead take the form of tabs, alternatively referred to as flaps, protrusions, pillars, bumps, or projections.

Figure 10:
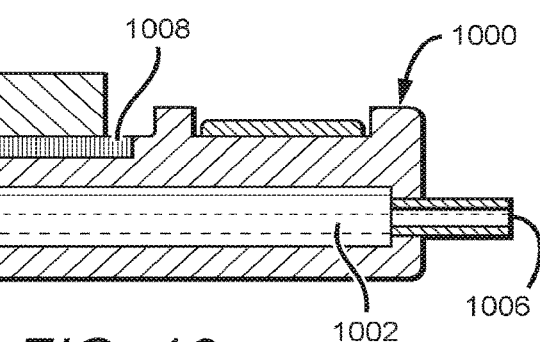
FIG. 10 illustrates another embodiment of a thermal-interface-material free thermal management apparatus having a liquid flow channel.

FIG. 10 illustrates another embodiment of a thermal-interface-material free thermal management apparatus that has a liquid flow channel to remove excess heat from a high powered device. The unitary body 1000 is formed having an internal liquid flow channel 1002 that receives liquid through an inlet 1004, and having an outlet 1006. The unitary body 1000 has a plurality of high aspect ratio micro-pillars 1008 formed with the remainder of the unitary body 1000 using a layer-based additive manufacturing technique such as that described above.

We claim:

1. A method of building a thermal-interface-material (TIM)-free thermal management system, comprising:
    providing a substrate comprising thermally conductive material, the substrate having an integrated circuit (IC) side and an opposite side disposed opposite the IC side;
    forming cross-sectional layers of a plurality of IC interfaces extending from the IC side using a layer-based additive manufacturing technique;
    forming cross-sectional layers of a radio-frequency (RF) circuit on the IC side using the layer based additive manufacturing technique; and
    forming cross-sectional layers of an enclosure on the opposite side of the substrate using the layer based additive manufacturing technique;
    wherein the substrate, the plurality of IC interfaces, and the enclosure form parts of a homogenous and thermally conductive unitary structure without a TIM in between the parts.

2. The method of claim 1, wherein the layer-based additive manufacturing technique is at least one of electroplating, electron beam melting (EBM), selective laser melting (SLM), electron beam evaporation (EBE), and selective laser sintering (SLS).

3. The method of claim 1, further comprising:
    forming cross-sectional layers of a plurality of first wicks extending from the opposite side of the substrate using the layer-based additive manufacturing technique.

4. The method of claim 3, further comprising:
forming cross-sectional layers of a plurality of support structures extending from the opposite side of the substrate using the layer-based additive manufacturing technique.

5. The method of claim 1, further comprising forming cross-sectional layers of the substrate using the layer-based additive manufacturing technique.

6. The method of claim 1, wherein the plurality of integrated circuit (IC) interfaces are micro-pillars having a height in a range of 10 μm to 1000 μm and a diameter in a range of 1 μm to 1,000 μm.

7. The method of claim 6, wherein the micro-pillars are formed in an array having a length in a range of 5 mm to 7 mm and a width in a range of 5 mm to 7 mm.

8. The method of claim 6, further comprising depositing a solder layer on a surface of the micro-pillars for attachment of an electronic device.

9. The method of claim 3, wherein forming the cross-sectional layers of the plurality of the first wicks comprises forming layers of the plurality of the first wicks until a height in a range of 100 μm to 1 μm is achieved, wherein the plurality of the first wicks comprise a diameter in a range of 1 μm to 500 μm and collectively have a pore size in a range of 1 μm to 50 μm.

10. The method of claim 1, wherein forming cross-sectional layers of the enclosure on the opposite side of the substrate comprises:
forming cross-sectional layers of sidewalls extending from the opposite side of the substrate using the layer-based additive manufacturing technique;
forming cross-sectional layers of an evaporation surface extending from the opposite side of the substrate including cross-sectional layers of a plurality of first wicks extending from the evaporation surface using the layer-based additive manufacturing technique; and
forming cross-sectional layers of a condensation surface extending from a second end of the side walls opposite a first end of the side walls adjacent to the evaporation surface, including forming cross-sectional layers of a plurality of second wicks extending from the condensation surface using the layer-based additive manufacturing technique,
wherein the sidewalls, the evaporation surface, and the condensation surface form the enclosure.

11. The method of claim 10, further comprising forming cross-sectional layers of a support pillar from the opposite side of the substrate using the layer-based additive manufacturing technique, wherein the support pillar is intermediate two of the sidewalls.

12. The method of claim 11, further comprising forming cross-sectional layers of a plurality of third wicks extending from at least one of the sidewalls, the support pillar, or a combination thereof using the layer-based additive manufacturing technique.

13. The method of claim 1, wherein the layer-based additive manufacturing technique is electroplating.

14. The method of claim 1, wherein the layer-based additive manufacturing technique is electron beam melting (EBM).

15. The method of claim 1, wherein the layer-based additive manufacturing technique is electron beam evaporation (EBE).

16. The method of claim 1, wherein the layer-based additive manufacturing technique is selective laser melting (SLM).

17. The method of claim 1, wherein the layer-based additive manufacturing technique is selective laser sintering (SLS).

* * * * *